US005446333A

United States Patent [19]

Ishida et al.

[11] Patent Number: 5,446,333

[45] Date of Patent: Aug. 29, 1995

[54] ULTRASONIC TRANSDUCERS

[75] Inventors: Yoshihiko Ishida, Nagoya; Makoto Tani, Inazawa, both of Japan

[73] Assignee: NGK Insulators, Ltd., Japan

[21] Appl. No.: 120,761

[22] Filed: Sep. 15, 1993

[30] Foreign Application Priority Data

Sep. 21, 1992 [GB] United Kingdom ................. 9219887
Mar. 30, 1993 [JP] Japan ................................. 5-072579

[51] Int. Cl.[6] ............................................ H01L 41/08
[52] U.S. Cl. ..................................... 310/334; 310/360
[58] Field of Search ............................... 310/334-337, 310/360, 361

[56] References Cited

U.S. PATENT DOCUMENTS

| | | | |
|---|---|---|---|
| 2,427,348 | 9/1947 | Bond et al. | 367/135 |
| 3,846,649 | 11/1974 | Lehmann et al. | 310/334 |
| 4,096,756 | 6/1978 | Alphonse | 310/334 X |
| 4,195,244 | 3/1980 | Heyman | 310/311 |
| 4,354,132 | 10/1982 | Borburgh et al. | 310/334 |
| 4,356,422 | 10/1982 | Van Maanen | 310/334 X |
| 4,427,912 | 1/1984 | Bui et al. | 310/334 X |
| 4,583,018 | 4/1986 | Izumi et al. | 310/334 |
| 4,692,653 | 9/1987 | Kushida et al. | 310/334 |
| 4,811,307 | 3/1989 | Pohlenz et al. | 367/135 |

FOREIGN PATENT DOCUMENTS

| | | |
|---|---|---|
| 0420190 | 4/1991 | European Pat. Off. . |
| 0505703 | 8/1920 | France . |
| 2581821 | 11/1986 | France . |
| 58-63300 | 4/1983 | Japan . |
| 2029091 | 3/1980 | United Kingdom . |
| 2201318 | 8/1988 | United Kingdom . |

OTHER PUBLICATIONS

Patent Abstracts of Japan, vol. 7, No. 154 (E-185)(1299) 6 Jul. 1983 & JP-A-58 063 300 (Keisuke Honda) 15 Apr. 1983.

Journal of the Acoustical Society of America, vol. 64, No. 1, Jul. 1978, New York, US, pp. 243-249, Joseph S. Heyman "Phase insensitive acoustoelectric transducer".

J. S. Heyman and J. H. Cantrell, Jr. "Application of an Ultrasonic Phase Insensitive Receiver to Material Measurements", 1977 Ultrasonics Symposium Proceedings, IEEE Cat. #77CH1264-1SU, pp. 124-128.

J. S. Heyman "Phase Insensitive Acoustoelectric Transducer", J. Acoutst. Soc. Am 64(1), Jul. 1978 pp. 243-249.

*Primary Examiner*—Mark O. Budd
*Attorney, Agent, or Firm*—Parkhurst, Wendel & Rossi

[57] ABSTRACT

An ultrasonic transducer unit for use in pulse-echo ultrasonic investigation has a plurality of components including a piezoelectric ultrasonic wave transmitting element, an acoustoelectric ultrasonic wave receiving element and electrodes therefor. To provide a compact and efficient transducer, these components are bonded together in an integrated multilayer structure in which the transmitting element and receiving element are superimposed in the direction of propagation of transmitted and received ultrasonic waves. The receiving element may be a ZnO single crystal. An insulating layer isolates two components from each other.

18 Claims, 2 Drawing Sheets

ULTRASONIC TRANSDUCERS

BACKGROUND OF THE INVENTION

1. Field of the Invention

This invention relates to ultrasonic transducers of the type used in the pulse-echo mode of ultrasonic investigation.

2. Description of the Prior Art

Copending patent application number U.S. Ser. No. 08/037,457 to which reference is now made, describes the composition, properties and operation of an acoustoelectric ultrasonic transducer element, particularly a ZnO single crystal element. One important feature of this element is that the frequency of the electrical signal output by the transducer is in principle different from the frequency of the ultrasonic pulse which causes the electrical signal. Therefore, no acoustic separation layer is required in order to prevent interference between the transmitted ultrasonic pulse and output electrical pulse corresponding to the received ultrasonic pulse.

Another important advantage is the phase-insensitivity of the acoustoelectric element. The acoustoelectric transducer can detect a boundary having a rough or wavy surface, a boundary between materials having close acoustic impedance, a boundary between organs of a living body and so on, since phase-insensitive transducers can detect even spatially inhomogeneous waves or frequency modulated waves.

The acoustoelectric transducer also has the capability of working as a phase-sensitive transducer, i.e. using the conventional piezoelectric effect. In conjunction with this phase-sensitive feature, the acoustoelectric transducer acting as a phase-insensitive transducer and as a phase-sensitive transducer can detect energy of incident ultrasonic wave (acoustoelectric signal) and the phase of the wave (piezoelectric signal) at the same time. This feature allows the transducer to have improved sensitivity and improved S/N ratio. More advanced post-signal-processing can be employed. A good example of this feature is its application to the conventional ultrasonic micrograph technique using piezoelectric transducers. This technique utilizes energy spectral analysis; the received signals are first low pass filtered and digitized, and then their energy spectra are computed by algorithms such as FFT (fast Fourier transform). These spectra have been shown empirically as well as analytically to be closely related to the geometry and orientation of the ultrasonic reflectors such as flaws. Incident energy data in conjunction with phase data are essential information for this type of computation. The received signal is a product of intensity and phase, but a piezoelectric transducer cannot separate these. The acoustoelectric transducer can achieve this separation, as explained above.

Another advantage is that since the acoustoelectric element does not need to receive the incident ultrasonic wave perpendicularly, the angular setting of the receiving element is not critical and an adjustment mechanism is unnecessary.

U.S. Pat. No. 4,195,244 describes use of a CdS single crystal as an ultrasonic phase-insensitive acoustoelectric transducer, and suggests very briefly that this acoustoelectric transducer may be used in combination with a conventional transducer in a concentric configuration or a transmission through configuration. No details are given.

JP-A-58-63300 describes a multi-frequency ultrasonic oscillator in which two piezoelectric oscillators are laminated together, with electrodes on the outer faces and an electrode sandwiched between them. Resonances of different frequencies can be obtained, by varying the applied frequency and the method of driving. The aim appears to be to allow frequent switching of frequency, e.g. in a fish detector.

SUMMARY OF THE INVENTION

The object of the present invention is to provide a compact, simple and efficient ultrasonic transducer unit including an acoustoelectric transducer element, for use in the pulse-echo mode.

According to the invention in one aspect there is provided an ultrasonic transducer unit for use in pulse-echo ultrasonic investigation, comprising a piezoelectric ultrasonic wave transmitting element, an acoustoelectric ultrasonic wave receiving element and electrodes therefor bonded together in an integrated multi-layer structure in which said transmitting element and said receiving element are superimposed in the direction of propagation of transmitted and received ultrasonic waves.

The invention is based on the realization that an effective and compact structure of a transducer can be achieved by integrating an acoustoelectric element and a piezoelectric transmitting element into a unitary bonded multi-layer structure. This arises from the fact that the acoustoelectric and piezoelectric response signals of the acoustoelectric element can be made separate in frequency (e.g. by selection of the thickness of the acoustoelectric element). It has been found that ultrasonic signals can be satisfactorily transmitted and received, e.g. in pulse-echo testing, using such a stacked, integrated structure. It must be remembered that such a structure is impossible for a conventional transducer in which piezoelectric elements both transmit and receive signals. By the invention, structures having the advantages of an identical wave path for both transmission and reception, and of low propagation loss can be obtained.

By an acoustoelectric receiving element here is meant a transducer element having acoustoelectric behavior made of piezoelectric semiconducting material, e.g. a ZnO or CdS single crystal. The piezoelectric transmitting element may typically be made of a conventional material such as quartz or a PZT (Pb-Zr-titanate) ceramic material, which emits ultrasonic waves of frequency equal to that of the driving electrical signal or of frequency defined by the design of the transmitter, or may be itself an acoustoelectric element e.g. a ZnO or CdS single crystal.

The transducer unit includes electrodes for input signals to cause ultrasonic wave emission by the transmitting element and for output signals generated by the incoming ultrasonic waves in the receiving element. Preferably the transmitting element and the receiving element have a common electrode sandwiched between them.

The transmitting element is preferably further from the emitting/receiving face of the unit than the receiving element, since this configuration can avoid generation of a reflected pulse at an interface between the transmitting element and a backing layer. However, the alternative configuration is feasible. When the transmitting element is closer to the emitting/receiving face of the unit than the receiving element, it is preferable that a backing layer is present.

The multi-layer structure may include a matching layer at the emitting/receiving face and also a backing layer to absorb received ultrasonic waves. However in particular a backing layer is not essential, since signals generated by reflection of the received wave can easily be filtered out. Suitable matching and backing layers are known in the art.

The thickness of the acoustoelectric element in the direction of propagation of the detected ultrasonic wave determines the frequency of the acoustoelectric component of the output electrical signal corresponding to the detected wave, and as mentioned this thickness should therefore be selected in order to achieve a suitable separation of frequencies between the output acoustoelectrical signal and the piezoelectric response. This choice of thickness in the propagation direction does not affect the possibilities for choice of*dimensions in the two directions perpendicular to the propagation direction.

A particularly advantageous form of the invention is obtained when there is provided at least one electrically insulating layer insulating two components of an integrated multilayer structure comprising at least a piezoelectric ultrasonic wave transmitting element, an acoustoelectric ultrasonic wave receiving element and electrodes therefor. One of the two components mutually insulated by the insulating layer may be a grounded conductor, e.g. an electrode of at least one of the transmitting and receiving elements or a shield electrode.

Preferably the insulating layer has an electrical impedance which is higher than that of said acoustoelectric receiving element at the intended operating frequency of said unit.

Preferably also the ratio (r) of the acoustic impedance of said insulating layer to that of said acoustoelectric receiving element is in the range given by $0.5 \leqq r \leqq 2.0$.

Suitably the dielectric constant of the material of said insulating layer is smaller than that of the material of said acoustoelectric receiving element.

By the use of such an insulating layer there can be obtained structures having effective electrical insulation, combined with good transmissivity for ultrasonic waves, resulting in high ultrasonic sensitivity. Selection of the value of the ratio r in the range as defined above provides particularly good transmissivity in the device. Because the electrical impedance of the acoustoelectric element is typically high (e.g. 100 kΩ up to 10 MΩ at the operating frequency), it is advantageous to select a material for the insulating layer having a high electrical impedance at high frequency, and a material having a low dielectric constant can fulfill these requirements.

Preferred materials having a low dielectric constant and no piezoelectric effect, for use as the insulating layer are oxide single crystals of sapphire and the like, and halides of alkali or alkaline earth metals such as LiF, $CaF_2$, $BaF_2$ and the like.

BRIEF INTRODUCTION OF THE DRAWINGS

Embodiments of the invention will now be described by way of non-limitative example with reference to the accompanying diagrammatic drawings, in which.

DESCRIPTION OF THE PREFERRED EMBODIMENTS

Figure 1:
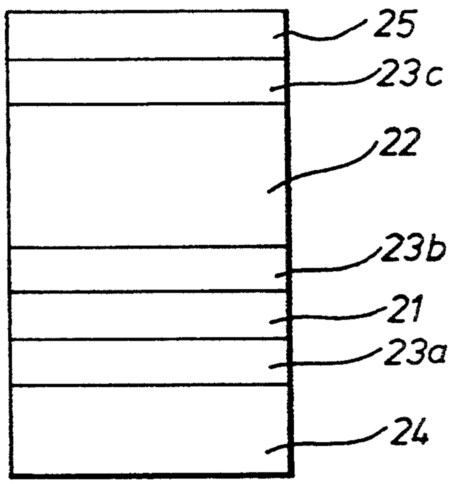
FIG. 1 is a diagrammatic sectional view of a first transducer unit embodying the invention.

In the Figures, the same reference numerals are used for corresponding parts, and a full description of such parts is not required for each embodiment. Since the drawings are diagrammatic and not to scale, cross-hatching is omitted.

FIG. 1 shows a sectional view in a plane parallel to the transmitting/receiving direction for ultrasonic waves, of a transducer unit having a bonded integrated multi-layer structure in which the transmitting and receiving transducer elements are combined. The emitting/receiving face is uppermost in FIG. 1. The uppermost layer 25 of the transducer unit is a matching layer and the lowermost layer 24 is a backing layer. In between the layers 24 and 25 are a piezoelectric transmitting element layer 21 (e.g. of PZT or quartz) and an acoustoelectric receiving element layer 22 of piezoelectric semi-conducting material (e.g. a ZnO single crystal) sandwiched between three electrodes **23*a*, 23*b*, 23*c*. The layer 22 is closer to the emitting/receiving face than the layer 21. The electrode 23*b* is common for the two elements 21,22**. If desired four electrodes may be used, instead of three.

Figure 2:
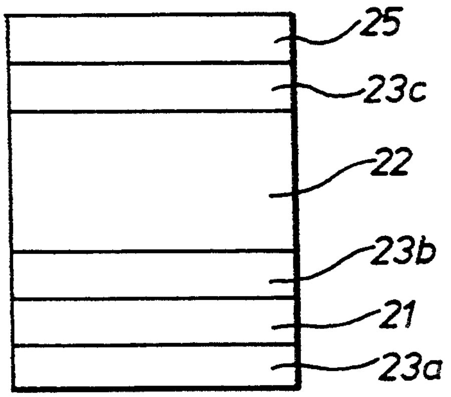
FIG. 2 is a diagrammatic sectional view of a second transducer unit embodying the invention.

As FIG. 2 shows, the backing layer 24 may be omitted from the integrated structure of FIG. 1. In this case, the received ultrasonic wave may be reflected repeatedly in the transducer, to generate an alternating acoustoelectric (AE) signal in the acoustoelectric layer 22. This alternating AE electrical signal can be easily separated electronically from the piezoelectric response (PE) in the output signal of the acoustoelectric layer 22.

In operation of the units of FIGS. 1 and 2, the signal to cause emission of ultrasonic waves is applied to the electrodes **23*a* and 23*b*. The received ultrasonic waves produce at the electrodes 23*b* and 23*c* an output signal having two components, i.e. the piezoelectric signal generated by the layer 22 and the acoustoelectric signal generated by the layer 22**.

One construction of the transducer unit of FIG. 1 is as follows. The matching layer 25 is an epoxy resin coating 0.07 mm thick (this thickness being typical for 10 MHz ultrasound investigation). The electrodes **23*a*, 23*b*, 23*c* are thin layers of thermally bonded In (indium) metal. The transmitting element layer 21 is a mechanically machined layer of quartz (or PZT) 0.19 mm thick. The receiving element layer 22 is a mechanically machined single crystal of ZnO produced by a hydrothermal process and is 5.0 mm thick. Reference should be made to copending application U.S. Ser. No. 08/037,457 mentioned above, for further details of a suitable ZnO single crystal. The backing layer 24 is 10 mm thick and made of tungsten-loaded epoxy resin. The unit of FIG. 2 is the same except that the backing layer 24** is omitted.

To make these units, two thin films of indium metal are thermally bonded at the melting point of indium metal to the opposite surfaces of the ZnO single crystal 22. A metal paste of In powder may be inserted between the metal films and the crystal, to improve electrical contact. Indium is chosen in order to avoid a contact potential difference with the ZnO, since In metal has a Fermi level similar to that of ZnO crystal. Another metal or alloy having a similar Fermi level, e.g. In-Ga alloy, may be used alternatively.

To one side of the quartz crystal 21 (or PZT layer), a thin film of In is thermally bonded at the In melting point, and this structure is thermally bonded in the same manner to one of the electrode films on the ZnO crystal 22. Epoxy resin for the layer 25 is then coated on the top electrode 23*c*, and the backing layer 24, if used, is attached at the other side.

A ZnO single crystal of suitable thickness or another acoustoelectric material, can be used for the transmitting element layer 21, instead of quartz or PZT.

FIGS. 3 to 6 illustrate further bonded integrated multi-layer structures of the invention.

Figure 3:
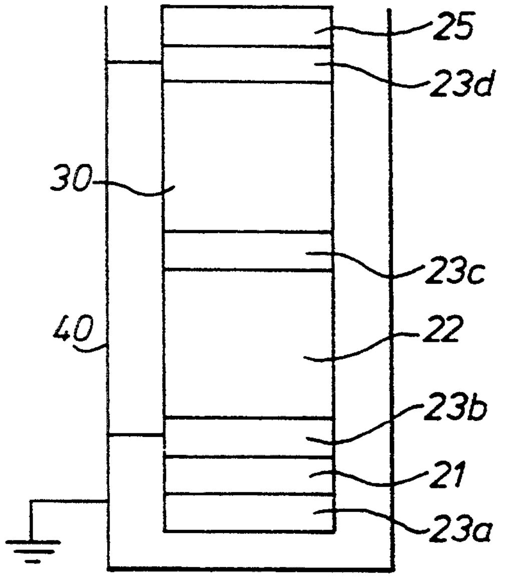
FIG. 3, FIG. 4, FIG. 5 and FIG. 6 are respective diagrammatic sectional views of third, fourth, fifth and sixth embodiments of the invention, each having an insulating layer and shielding casing.

The transducer unit shown in FIG. 3 is mainly housed inside a grounded metal shield casing 40 spaced from the acoustoelectric and piezoelectric elements 21,22. The transducer unit includes a common electrode 23*b*, sandwiched between the PZT piezoelectric transmitting element 21 and the ZnO single crystal acoustoelectric receiving element 22. The electrode 23*b* is electrically connected to the shield casing 40, so as to serve as a ground electrode. This structure is further sandwiched between two electrodes 23*a* and 23*c*, which serve as signal electrodes, positioned next to elements 21 and 22 respectively. A shield electrode 23*d*, electrically connected to the casing 40, is positioned between the matching layer 25 at the emitting/receiving face of the unit and the elements 21 and 22. An insulating layer 30 is positioned between the shield electrode 23*d* and the next component of the structure closest to the emitting/receiving face of the unit, more specifically in this case, the signal electrode 23*c* of the receiving element 22. The insulating layer 30 acts to insulate the receiving electrode 23*c* from the shield electrode 23*d* and thus also from the casing 40.

Figure 4:
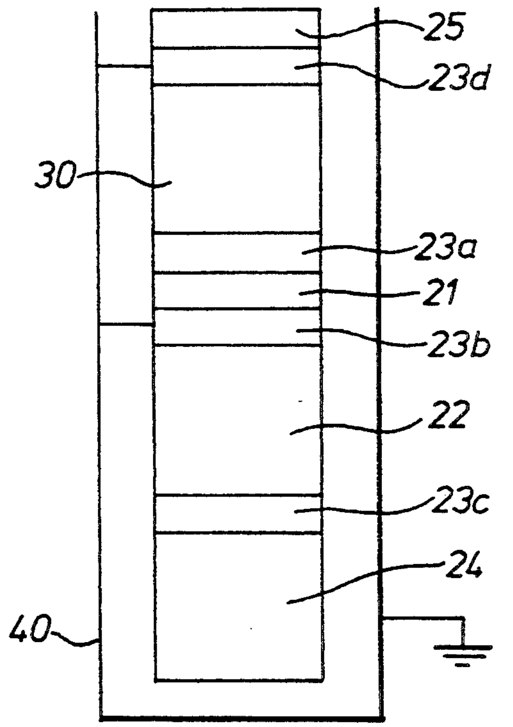

FIG. 4 shows an example of a transducer possessing a backing layer 24. In this example, the transmitting element 21 is located closer to the emitting/receiving face of the unit than the acoustoelectric receiving element 22. Signal electrodes 23*a* of the transmitting element 21 and the shield electrode 23*d* are separated by the insulating layer 30.

Figure 5:
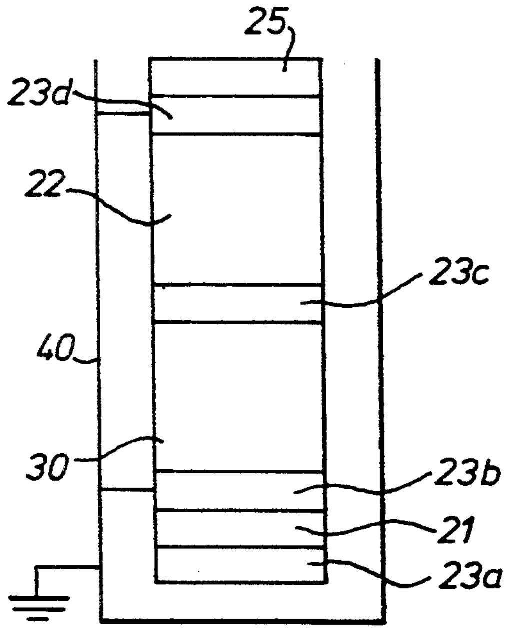

The transducer shown in FIG. 5 has the insulating layer 30 sandwiched between the grounded electrode 23*b* and the signal electrode 23*c* of the acoustoelectric element 22. The piezoelectric transmitting element 21 and the acoustoelectric receiving element 22 sandwich this structure. The insulating layer 30 insulates the electrode 23*b* from electrode 23*c* electrically, while linking the transmitting element 21 and the receiving element 22 acoustically.

Figure 6:
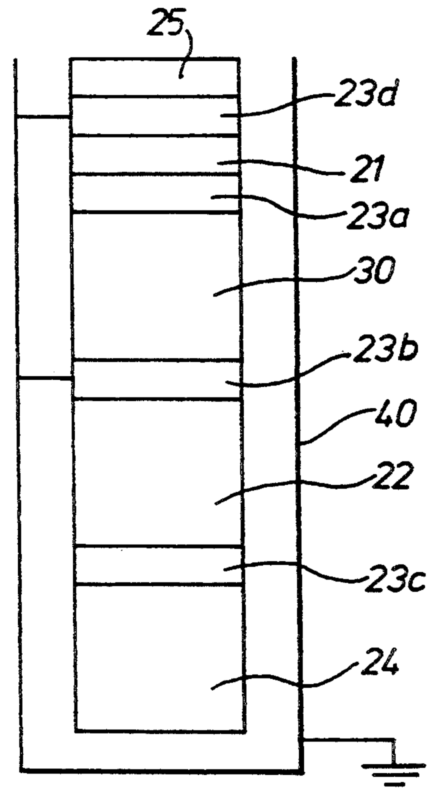

In the embodiment illustrated in FIG. 6, the positions of the transmitting element 21 and the receiving element 22 are reversed and there is an addition of a backing layer 24, as compared to the example in FIG. 5.

In all of the embodiments of FIGS. 3 to 6, the integrated multi-layer structure of the matching layer 25, the shielding electrode 23*d* (which is a metal sheet or film), the elements 21,22, the electrodes 23*a,b,c,* the insulating layer 30 and the backing layer 40 are bonded into an integrated unit, in the manner already described for FIGS. 1 and 2.

The insulating layer 30 in these embodiments of FIGS. 3 to 6 enables the reception of the electrical signal output .produced by the received ultrasonic wave without weakening of the signal, or with minimal signal weakening.

In each of the embodiments of FIGS. 3 to 6, the insulating layer 30 is a single crystal of MgO and is typically characterized by a relative dielectric constant of 9.7, an electrical impedance of 300 kΩ at 10 MHz and an acoustoelectric impedance of $3.2\times10^6$ g/cm$^2$'S.

On the other hand, the ZnO single crystal as the receiving element 22 is characterized typically by a relative dielectric constant of 10.2, an electrical impedance of 250 kΩ at 10 MHz and an acoustoelectric impedance of $3.5\times10^6$ g/cm$^2$'S.

The embodiments above give examples of an insulating layer 30 of a single crystal MgO; however, other suitable materials may be substituted in its place.

Although the invention has been illustrated by specific embodiments, other embodiments and modifications are available to those skilled in the art, within the scope of the invention.

What is claimed is:

1. An ultrasonic transducer unit for use in pulse-echo ultrasonic investigation at an operating frequency, comprising at least a piezoelectric ultrasonic wave transmitting element, an acoustoelectric ultrasonic wave receiving element consisting essentially of a ZnO single crystal, and electrodes therefor bonded together in an integrated multi-layer structure in which said transmitting element and said receiving element are superimposed in the direction of propagation of transmitted and received ultrasonic waves, said unit further comprising an electrically insulating layer in said integrated multi-layer structure for electrically insulating two components of said ultrasonic transducer unit from each other, said insulating layer consisting essentially of MgO and having an electrical impedance which is higher than that of said acoustoelectric receiving element at the operating frequency of said unit.

2. An ultrasonic transducer unit according to claim 1 wherein said piezoelectric transmitting element comprises a material selected from the group consisting of quartz, PZT ceramic, CdS and ZnO single crystal.

3. An ultrasonic transducer unit according to claim 1 wherein said acoustoelectric receiving element comprises a material selected from the group consisting of CdS and ZnO single crystal.

4. An ultrasonic transducer unit according to claim 1, wherein said piezoelectric transmitting element and said acoustoelectric receiving element have one of said electrodes acting as a common electrode sandwiched between them.

5. An ultrasonic transducer unit according to claim 1, wherein said piezoelectric transmitting element is further from an emitting/receiving face of the unit for transmitted and received ultrasonic waves than said acoustoelectric receiving element.

6. An ultrasonic transducer unit according to claim 1, further comprising, as part of said integrated multi-layer structure, a matching layer at an emitting/receiving face of the unit for transmitted and received ultrasonic waves.

7. An ultrasonic transducer unit according to claim 1, further comprising, as part of said integrated multi-layer structure, a backing layer to absorb received ultrasonic arranged further from the emitting/receiving face of the unit for transmitted and received ultrasonic waves than both said piezoelectric transmitting element and said acoustoelectric receiving element.

8. An ultrasonic transducer unit according to claim 1, wherein said piezoelectric transmitting element and said acoustoelectric receiving element are thermally bonded to metal films constituting said electrodes.

9. An ultrasonic transducer unit according to claim 1, wherein one of said two components is a grounded conductor.

10. An ultrasonic transducer unit according to claim 9, wherein said grounded .conductor is selected from (i) an electrode of one of said piezoelectric transmitting element and said acoustoelectric receiving element, and (ii) a shield electrode.

11. An ultrasonic transducer unit according to claim 1, wherein a ratio r of the acoustic impedance of said insulating layer to that of said acoustoelectric receiving element is in the range $0.5 \leqq r \leqq 2.0$.

12. An ultrasonic transducer unit according to claim 1, wherein the dielectric constant of the material of said insulating layer is smaller than that of the material of said acoustoelectric receiving element.

13. An ultrasonic transducer unit for use in pulse-echo ultrasonic investigation at an operating frequency, comprising a plurality of components superimposed in an integrated multi-layer structure in the direction of propagation of transmitted and received ultrasonic waves, said components comprising at least a piezoelectric ultrasonic wave transmitting element, an acoustoelectric ultrasonic wave receiving element consisting essentially of a ZnO single crystal, a plurality of electrodes for said transmitting and receiving elements, and at least one electrically insulating layer insulating two of said components of said multi-layer structure from each other, said insulating layer consisting essentially of MgO and having an electrical impedance which is higher than that of said acoustoelectric receiving element at the operating frequency of said unit.

14. An ultrasonic transducer unit according to claim 13, wherein one of said two components is a grounded conductor.

15. An ultrasonic transducer unit according to claim 14, wherein said grounded conductor is one of said electrodes for said piezoelectric transmitting element and said acoustoelectric receiving element.

16. An ultrasonic transducer according to claim 14, wherein said grounded conductor is a shield electrode.

17. An ultrasonic transducer unit according to claim 13, wherein a ratio r of the acoustic impedance of said insulating layer to that of said acoustoelectric receiving element is in the range $0.5 \leqq r \leqq 2.0$.

18. An ultrasonic transducer unit according to claim 13, wherein the dielectric constant of the material of said insulating layer is smaller than that of the material of said acoustoelectric receiving element.

* * * * *